United States Patent
Jitaru

(10) Patent No.: US 6,967,553 B2
(45) Date of Patent: Nov. 22, 2005

(54) PLANAR INDUCTIVE ELEMENT

(75) Inventor: Ionel Jitaru, Tucson, AZ (US)

(73) Assignee: Delta Energy Systems (Switzerland) AG, Berne (CH)

( * ) Notice: Subject to any disclaimer, the term of this patent is extended or adjusted under 35 U.S.C. 154(b) by 204 days.

(21) Appl. No.: 10/381,161

(22) PCT Filed: Sep. 20, 2001

(86) PCT No.: PCT/US01/42238
§ 371 (c)(1),
(2), (4) Date: Aug. 11, 2003

(87) PCT Pub. No.: WO02/25677
PCT Pub. Date: Mar. 28, 2002

(65) Prior Publication Data
US 2004/0080978 A1 Apr. 29, 2004

Related U.S. Application Data

(63) Continuation of application No. 09/668,060, filed on Sep. 20, 2000, now abandoned.

(51) Int. Cl.[7] .............................................. H01F 17/06
(52) U.S. Cl. .......................... 336/178; 336/212; 336/83
(58) Field of Search ................................ 336/200, 212, 336/83, 178, 165

(56) References Cited

U.S. PATENT DOCUMENTS

| | | | |
|---|---|---|---|
| 5,359,313 A | 10/1994 | Watanabe et al. | 336/178 |
| 5,816,894 A | 10/1998 | Hosozawa et al. | 451/28 |
| 5,914,644 A * | 6/1999 | Carter et al. | 333/12 |
| 6,417,753 B1 * | 7/2002 | Wolf et al. | 336/182 |
| 6,597,271 B2 * | 7/2003 | Busletta et al. | 336/178 |
| 6,650,218 B1 * | 11/2003 | Fushimi | 336/178 |
| 6,737,951 B1 * | 5/2004 | Decristofaro et al. | 336/234 |

FOREIGN PATENT DOCUMENTS

| | | |
|---|---|---|
| EP | 0230185 | 7/1987 |
| EP | 0388930 | 9/1990 |

(Continued)

*Primary Examiner*—Anh Mai
(74) *Attorney, Agent, or Firm*—Birdwell & Janke, LLP

(57) ABSTRACT

A storage magnetic element, which minimizes the power loss in the planar winding due to the fringe magnetic field associated with a discrete air gap, is presented. The invention describes a construction technique wherein the magnetic core is formed by an E section made of high permeability magnetic material and an I section made by a material capable to store energy due to its distributed gap structure. The I section of the magnetic core in one of the embodiments is covered by an electrically conductive shied to force the magnetic flux into the I section and to minimize the component of the fringe magnetic field perpendicular on the planar winding. In another embodiment of this invention the electrically conductive shield is replaced by a high magnetic permeability material to accomplished the same goal of reducing the magnetic field component perpendicular on the planar winding. In a prefer embodiment of this invention the I section of the magnetic core has a cavity which will accommodate the middle leg of the E section. This construction will force the fringe magnetic field at the edge of the gap to be parallel with the planar winding of the storage magnetic element. In another embodiment of this invention a flat I section is used with the addition of another high permeability magnetic material placed on the I section on top of the winding. This construction will force the fringe magnetic field around the edge of the gap to be parallel with the planar winding. The embodiments of this invention are aimed at reducing the fringe magnetic field perpendicular on the planar winding, lowering the eddy current induced by this field.

13 Claims, 5 Drawing Sheets

FOREIGN PATENT DOCUMENTS

| | | | |
|---|---|---|---|
| GB | 287656 | 5/1982 | |
| JP | 57096513 A * | 6/1982 | ........... H01F/37/00 |
| JP | 57126109 | 8/1982 | |
| JP | 61259511 A * | 11/1986 | ........... H01F/27/24 |
| JP | 06013243 | 1/1994 | |
| JP | 10149935 | 6/1998 | |
| JP | 11168011 | 6/1999 | |
| WO | PCT/US 01 42238 | 6/2002 | |

* cited by examiner

PLANAR INDUCTIVE ELEMENT

The present application is a national stage commencement of PCT application Ser. No. PCT/US01/42238, filed Sep. 20, 2001, which is a continuation of U.S. application Ser. No. 09/668,060, filed Sep. 20, 2000, and presently abandoned.

FIELD OF THE INVENTION

This invention relates to mechanical construction and its electrical results for planar inductors and planar transformers used as elements in power conversion technology.

BACKGROUND OF THE INVENTION

The industry demand for increasing power density and lowering the height of the power converters in power conversion area imposed the use of planar magnetic inductors and planar transformers. One approach of such planar element which can be an inductor or a transformer with energy storage capability includes two E magnetic cores 18,20 which surrounds a printed circuit board 6 embedding the windings made of plated copper 8. To be able to store energy and avoid the saturation of the magnetic material of the cores 18 and 20 a gap 28 is provided on the center leg area. During operation when a current is injected in the windings 8, the magnetic field produced by the windings will close through the magnetic material as depicted by the magnetic field lines 22, 24. The magnetic field lines are going through the outer legs of the magnetic core, 122, and 124, and through the center leg 120. Around the gap area the magnetic field lines are spread outside of the center leg due to the low permeability of the material placed in the gap, which is usually air. Some of these lines cut into the windings 8 as depicted in FIG. 1A. The component of the magnetic field perpendicular on the planar windings 8, Hv 128 will induce eddy current into the winding. The eddy current developed in the winding will create a magnetic field which will oppose the component of the magnetic field 30, perpendicular on the winding 128. The eddy current developed in the planar winding 8, will lead to additional power dissipation reducing the efficiency of the magnetic element and will create temperature rise in the planar winding. The goal for a magnetic storage element is to increase the efficiency with which the magnetic field is stored and further retrieved. The efficiency of a magnetic storage element is defined by the ratio between the energy retrieved form the magnetic element and the sum of the energy which is required to store the magnetic field and the energy stored in the magnetic element.

In order to minimize the losses due to the eddy current induced by the fringe magnetic field around the gap 28, the fringe magnetic field 30, shall have a minimum component vertical to the planar winding. This means that the magnetic field, which links the winding, shall be parallel with the planer winding.

An article entitled "Integrated Planar Inductor Scheme for Multi-module Interleaved Quasi-Square-Wave (QSW) DC/DC Converter",PESC 1999 Proceedings, pp.759–763, by W. Chen, P. C. Lee, X. Zhou and P. Xu proposes a two air gap arrangements made on the top and bottom section instead of the vertical leg. Since the magnetic field strength distributions in the winding window along the horizontal direction are more evenly distributed and the fringing fluxes near the air gaps are basically in parallel with the copper plated windings the AC losses are lower. They claim a 42.3% AC losses decrease for their approach.

Another articles aimed at reducing the negative impact of the magnetic core gap is entitled "Reduction of Eddy Current by FPC-Foil Windings in Power Transformers" PCIM'97 Proceedings, pp 315–322, by Markus Heckmann and Jurgen Hess, Hong Kong Conference held Oct. 14–17, 1997. In this article several FPC (Ferrite Polymer Composite) foils were wound around the discrete gap to minimize the fringe magnetic field cutting into the winding.

Another prior art concept depicted in FIG. 2 was presented by Bruce Carsten at PCIM'96 seminar held in Nuremberg, Germany. In his seminar Bruce Carsten sugest to combination of a E magnetic cosre using high permeability magnetic material and and I section made of a distributed air gap material.

Another approach depicted in FIG. 2 uses an E+ I cores 30 and 32 structure where the I core 32 can be made of a material, which can store a significant amount of energy. Such material can be powder iron material, cool-mu material or even ferrite material with low magnetic permeability. The powder Iron material and cool-mu material, have a distributed gap. This means that the energy is stored in the material itself in the small gap uniform distributed in its structure. In this patent we will refer to such a material as magnetic core with energy storage capability. As is presented in FIG. 2 the magnetic field lines generated by the current flowing through the planar winding 8, will link the center leg 120 and the outer legs 122 and 124 by the magnetic field lines 38 and 36. The magnetic field lines will also link the distributed storage element 32. Though some of the magnetic field lines will escape the I section 32, as is 34 and 132, the perpendicular component on the planar winding 8, of these magnetic field lines is greater reduced.

The magnetic field lines which escape the magnetic core structure 130, can induce currents into the circuits near by, leading to additional electromagnetic noise. The goal of the magnetic storage elements is to contain most of the magnetic field lines inside its structure to reduce the radiation. The noise induced by the magnetic field lines outside of its structure will negatively impact the EMI compliance imposed by the regulatory agencies. Another drawback of this concept is the fact that the core losses in the iron powder material are generally higher than the ones in the ferrite material, especially at higher frequency.

SUMMARY OF THE INVENTION

The embodiments of this invention address the drawbacks of the prior and provide easy means to reduce the influence of the fringing flux on the AC windings resistance.

Therefore, it is the principal object of the present invention to provide a novel and improved method to control the magnetic flux circulation through an E+I core structure used for an inductor or a transformer, comprising a printed circuit board which has embedded in its layers the inductor or transformer windings, surrounded by the E+I cores. This concept can apply to any planar inductor wherein the planar windings can be implemented into the PCB or any other technology.

It is another object of the present invention to provide a method that insures the decreasing manufacturing cost of the magnetic assembly structure.

Another goal of the present invention to provide a method that insures a reduced electromagnetic interference (EMI).

The foregoing and other objects, features and advantages of the present invention will be more readily understood upon consideration of the following detailed description of the invention together with the following drawings.

DESCRIPTION OF THE PREFERRED EMBODIMENTS

Figure 1:
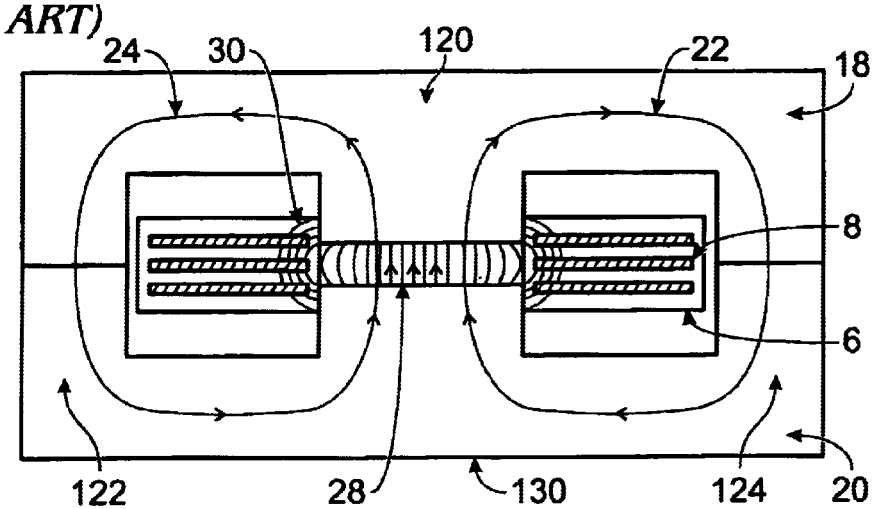
FIG. 1 illustrates a cross-section of a prior art structure.
Figure 1A:
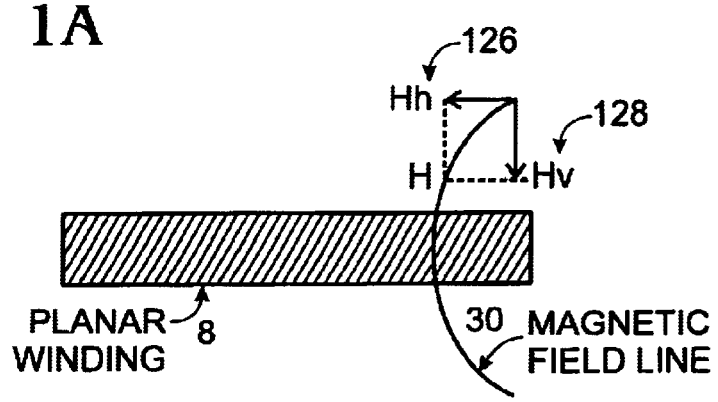
FIG. 1A illustrates a detail section of FIG. 1, to understand the loss mechanism due to the vertical component of the magnetic field, which crosses the winding.
Figure 2:
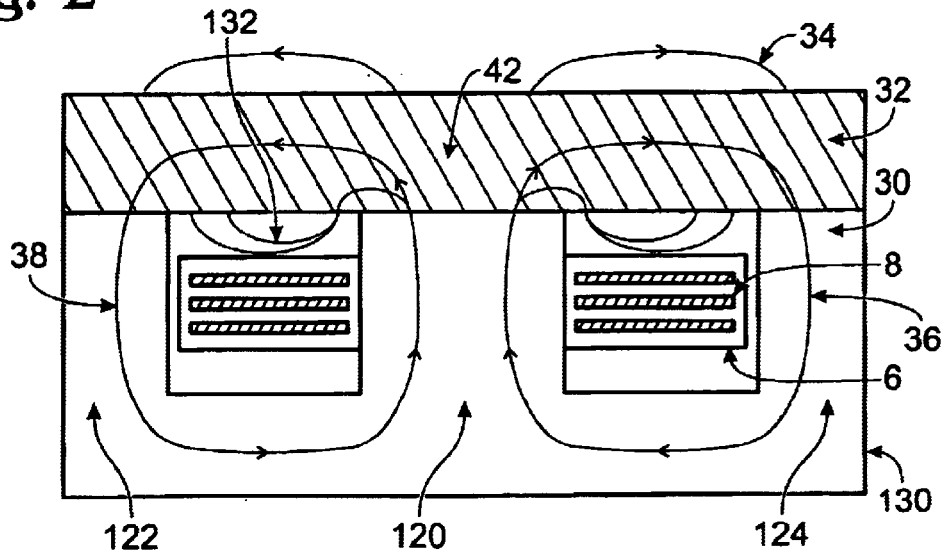
FIG. 2 illustrates a cross-section of another prior art structure.
Figure 3:
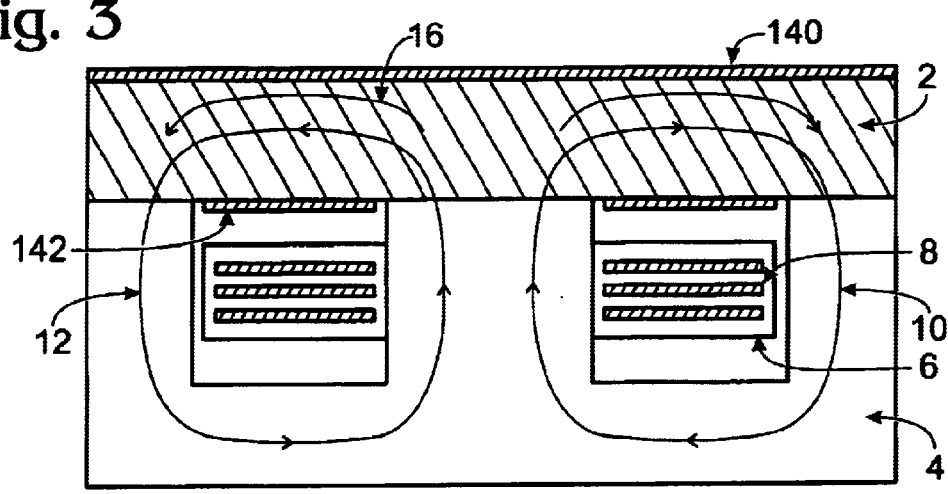
FIG. 3 illustrates a cross-section of the structure using an embodiment of this invention wherein electrically conductive shield is placed on top and some portion of the bottom area of the I section.

One approach presented in FIG. 3 uses a combination of an E magnetic core 4 made from a material with high magnetic permeability and an I core 2 made from a material which has energy storage capability. It can be a material, which provides a distributed gap such as iron powder material, cool-mu material or even a low permeability ferrite. The planar windings 8 are embedded into the printed circuit board 6. On the topside of the I core 2 and also on the bottom side, right into the winding window, there is a thin electrically conductive shield. The magnetic field lines 10 and 12 closed through the E magnetic core 4 and the I core 2. The top electrically conductive shield doesn't allow the magnetic field lines 16 to leave the inside of the I core 2. In addition the bottom electrically conductive shield doesn't allow the magnetic field lines to penetrate the planar embedded windings 8 and thus their AC resistance is not increased by an eddy currents distribution effect Hence the copper plated shield acts like a "flux tunnel" forcing the magnetic field to close through a specified path, which doesn't interfere with the embedded printed circuit board windings of the inductor or transformer. In this invention the electrically conductive shield can be placed only on the topside of the I section 2 as 140. The shield placed on the bottom side into the window area 142 may be optional in some application wherein the losses created by the fringe magnetic field which escape 2, leads to a tolerable copper loss in the planar winding 8. In the same time in some applications only the bottom shield 142 will be placed without the shield 140. The conductivity of the shield material has to be very good in order to minimize the conduction losses created by the eddy current injected into the shield by the magnetic field component vertical to the shield created by the fringe magnetic field.

Figure 3A:
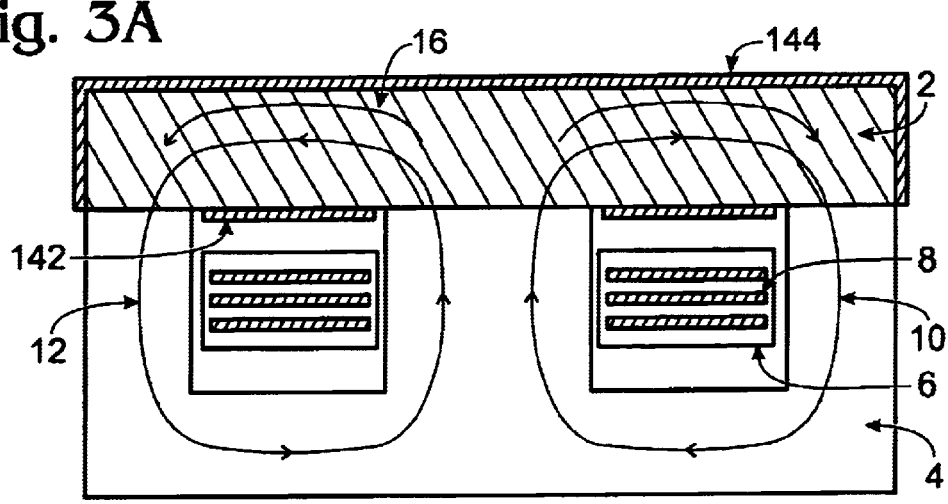
FIG. 3A illustrates a cross-section of the structure using another embodiment of this invention wherein the concept depicted in FIG. 3 is further modified by applying electrically conductive shield on the edges of the I section.
Figure 3B:
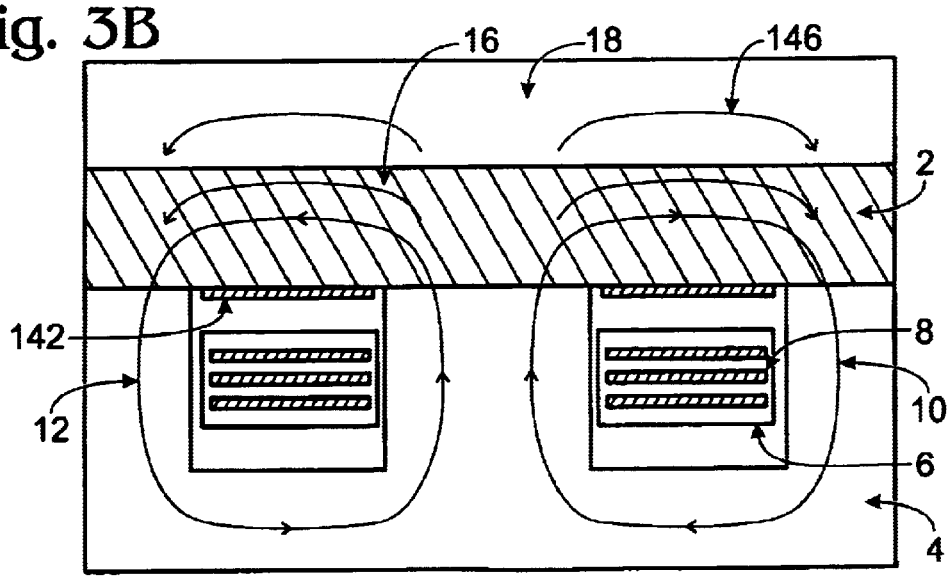
FIG. 3B illustrates a cross-section of the structure using another embodiment of this invention wherein the concept depicted in FIG. 3 is modified by replacing the top electrically conductive shield with a plate of high magnetic permeability material.
Figure 3C:
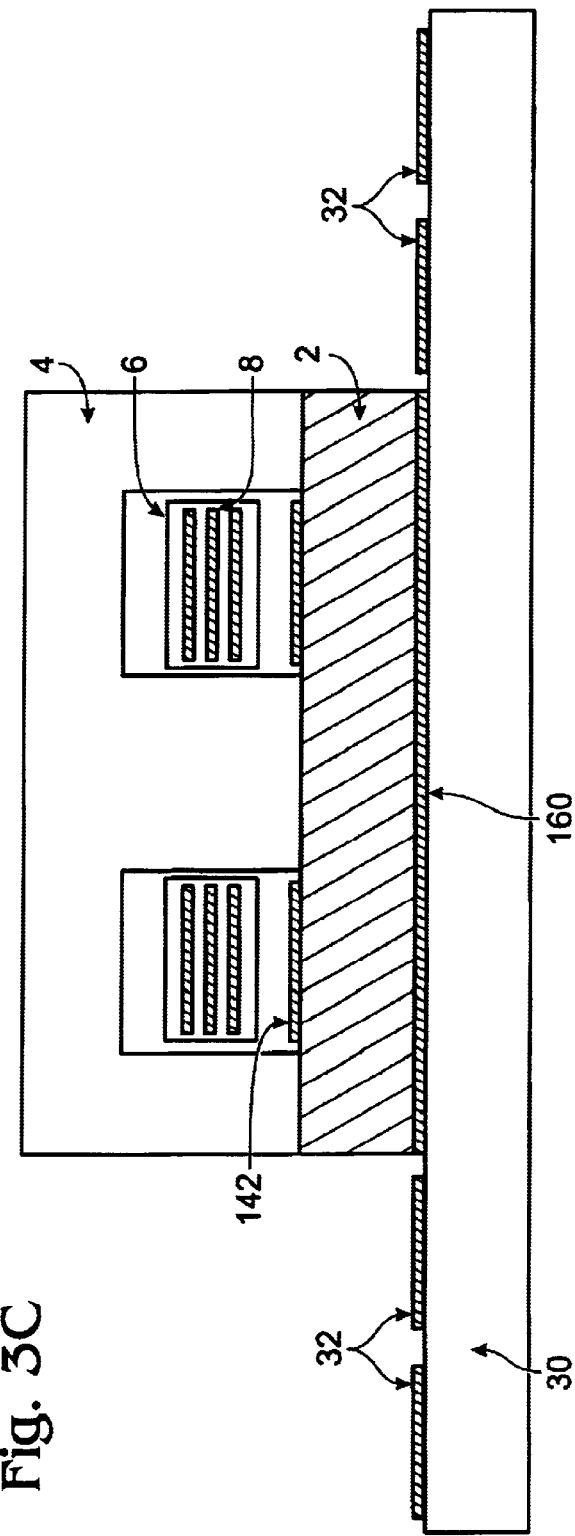
FIG. 3C illustrates a cross-section of the structure using another embodiment of this invention wherein the electrically conductive shield of FIG. 3 is replaced by a copper island placed on a PCB.

In case wherein the I section of the core 2 is placed on the external board, a copper island can be placed under the I section of the core as presented in FIG. 3C. In this case the copper island on the board 160 replaces the additional shield 140 depicted in FIG. 3.

A more elaborated approach presented in FIG. 3A uses the electrically conductive plating 144 also on the edges of the I core 2. This method will further reduce the radiated magnetic field reducing the noise associated with the eddy currents induced in near by circuits.

Another approach depicted in FIG. 3B uses on top of the I core 2 an I core 18 made from a high permeability magnetic material such as ferrite for example. The additional plate 18, will force the magnetic field to lines 146 to flow through it rather than escaping the magnetic structure. The same high permeability material used for the additional I section, 18 can be used for the plate 142, placed on the I section 2, inside of the winding area. Its mode of operation will be the same. It will decrease the vertical component to the surface of the planar winding 8, reducing the losses in the planar winding.

In the concepts depicted in FIGS. 3, 3A, 3B and 3C the electrically conductive material can be replaced by the high permeability material and vice versa. The electrically conductive shield or the plates made of high permeability material placed on the bottom of I section made of distributed gap material inside the winding area can be also placed on top of the planar inductive element. For example in the event wherein the planar inductive is implemented using multiplayer PCB technology, the top copper layer implemented as an open turn can form the electrically conductive shield. Another mode of implementation is to place on top of planar winding the FPC (Ferrite Polymer Composite) foil. The last two-example show that the concept can be implemented in different technological ways without departing from the true spirit and scope of the invention.

Figure 4A:
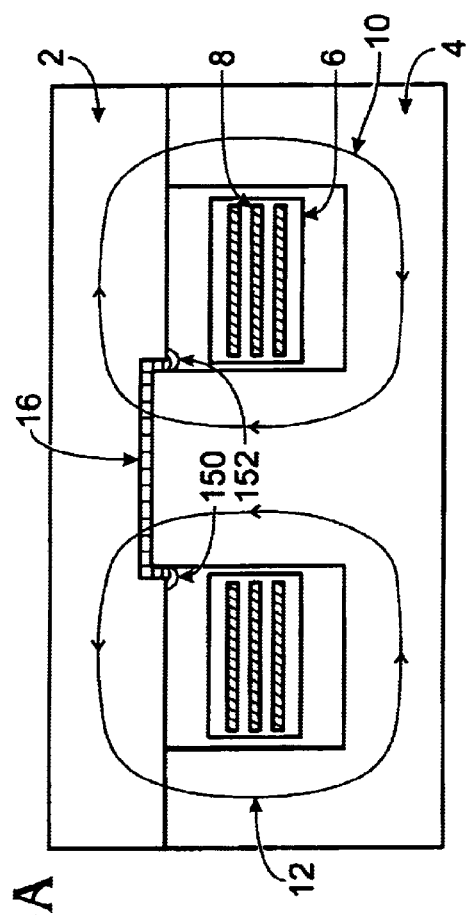
FIG. 4A illustrates a cross-section of the structure using another embodiment of this invention wherein the I section of the core is shaped to accommodate a longer center leg of the E section.

One of the preferred embodiments of this invention is presented in FIG. 4A. This approach uses a different structure for the E core 4 and I core 2. The I core 2 has a small height cutout made inside the material in front of the E core 4 center leg. In the same time the center leg of the E core 4 is higher than the outer legs. The distance between the center leg and the topside of the I core cutout represents the gap 16. This way the magnetic filed lines 150, 152, which close through the magnetic cores, try to distribute more parallel to the topside of the PCB 6 and its embedded windings 8, in the region they come close together. Thus the effect produced by eddy-currents is greatly reduced.

Figure 4B:
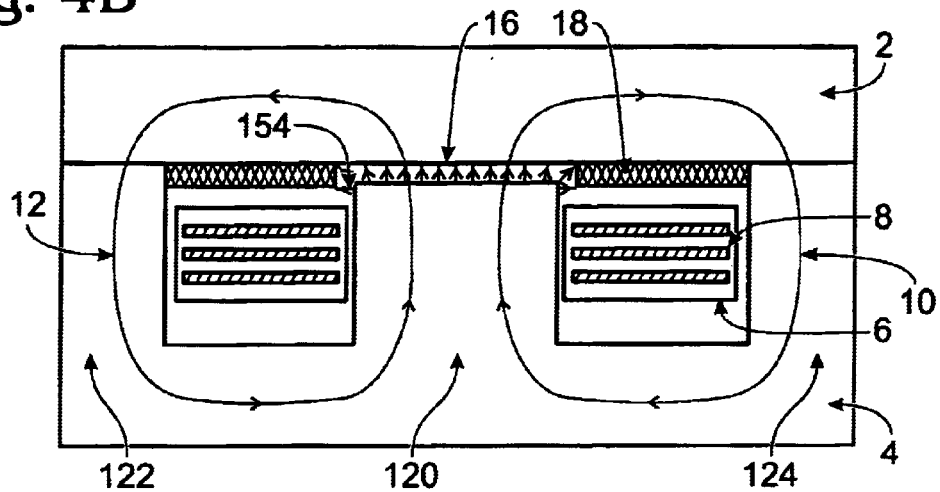
FIG. 4B illustrates a cross-section of the structure using another embodiment of this invention, wherein two additional plates of high magnetic permeability are placed on the bottom part of the I section.
Figure 4C:
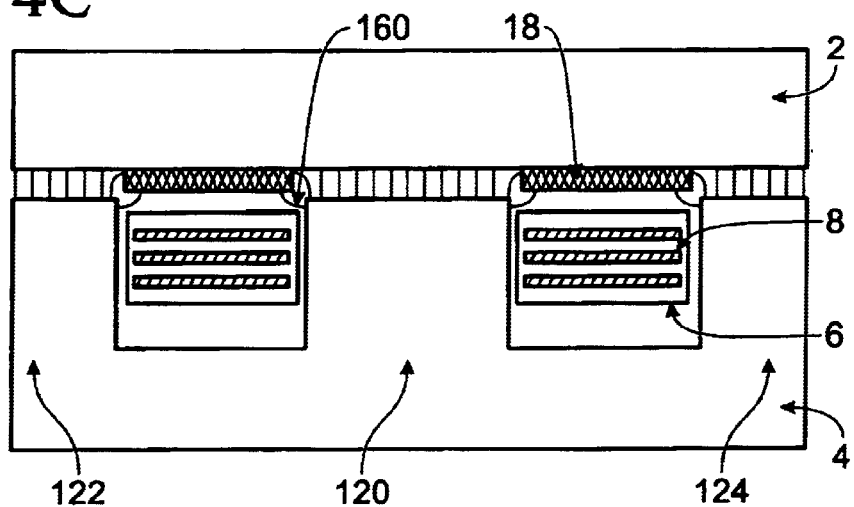
FIG. 4C illustrates a cross-section of the structure using another embodiment of this invention wherein the concept depicted in FIG. 4B is applied also to the outer legs.

Another approach depicted in FIG. 4B uses a standard E core 4 structured with the usual air gap 16 placed in the center leg, and I core 2 structure without any cavity. To reduce the effect of eddy-currents through the PCB 6 and its embedded windings 8 due to the fringe magnetic field 154, a special plate 18 made of high magnetic permeability material is placed underneath the I core 2. This way the fringing flux around the air gap is modified having a much larger horizontal component to the planar winding 8, minimizing the its vertical component. To further improve this structure in the event wherein the gap has to be larger a structure depicted in FIG. 4C. In FIG. 4C all the legs of the cores, the inner leg and the outer leg are gapped. The additional material 18 is placed on top of the winding area allowing a certain distance to the center leg and the outer legs. The fringe magnetic field lines 160, are parallel with the planar windings 8. The additional material 18 can be an FPC-Foil, which is a flexible compound of special synthetic resin plastic with sintered ferrite grains, which cause the magnetic behavior.

This tape can be placed on the I section of the core, 2 on the winding area. This material can be placed also on the planar inductor 6 towards the gap. The distance between this FPC-foil (Ferrite Polymer Composite) and the inner leg which is gapped and to the outer legs in the event wherein we have gap in all legs depends of the size of the discrete gap, the magnetic field intensity and other parameters.

Figure 4D:
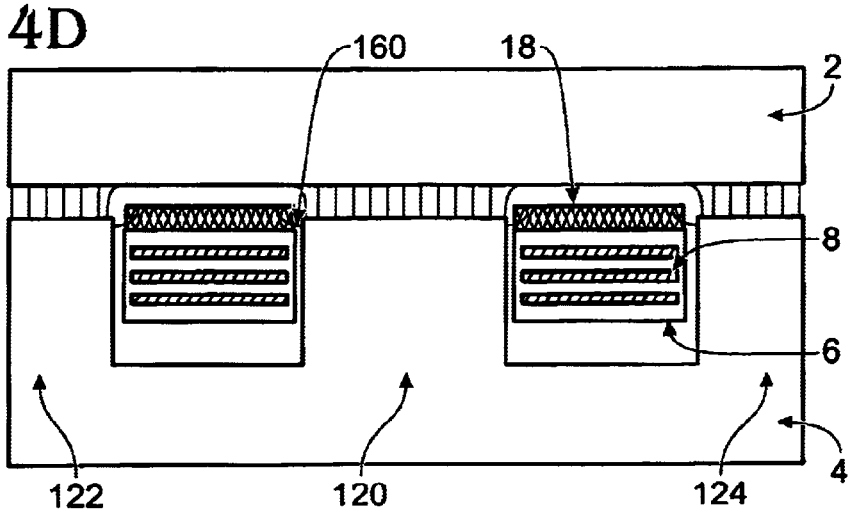
FIG. 4D illustrates a cross-section of the structure using another embodiment of this invention wherein the concept used in FIG. 4C is modified by applying the additional high permeability material on top of the planar winding.
Figure 4E:
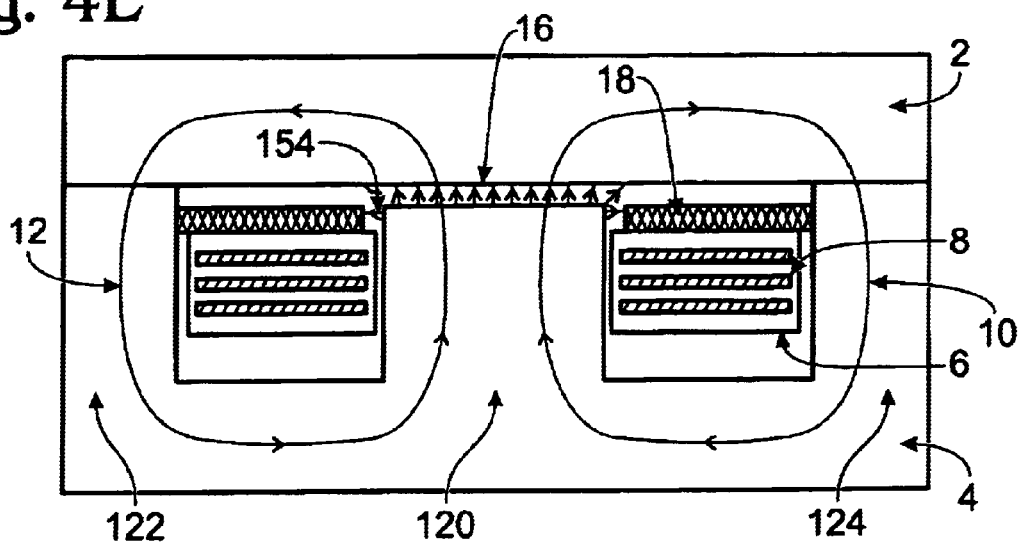
FIG. 4E illustrates a cross-section of the structure using another embodiment of this invention wherein the concept using in FIG. 4B is modified by applying the additional high permeability material on top of the planar winding.

In FIG. 4E and FIG. 4D the additional material 18 which can be a ferrite plate or a FPC-Foil is placed on top of the planar inductor winding. The additional material 18 with high magnetic permeability will create a path for the fringe magnetic field parallel with the planar winding 8. In FIG. 4E the additional material 18 shall be placed against the outer legs 122 and 124 and allow a gap towards the center leg 120. In FIG. 4D the additional material will be placed on top of the planar inductor winding to form a a gap to the outer legs and also the center legs.

Another advantage of the embodiment presented in FIGS. 4A, 4B, 4C, 4D and 4E is the fact that all the elements of the magnetic core, the E section 4, the I section 2, and die additional material 18 are made of ferrite which can have low high frequency core loss. As a result this concept can be used in high frequency high efficiency applications wherein the core loss has to be minimized. This concept is a very good solution for planar magnetic elements, which are designed to store energy in low profile, high density and high efficiency power converters. While there have been described and illustrated several specific embodiments of the inventions, it will be clear that variations in the details of the embodiments specifically illustrated and described may be made without departing from the true spirit and scope of the invention as defined in the appended claims.

What is claimed is:

1. A planar magnetic storage element comprising:
    a magnetic core comprising of an E shaped section and an I shaped section; the said I section made of, distributed gap material and said E section made of high permeability material; the said I shaped section having a top and a bottom side; an electrically conductive material is placed on said top side; the said I section is placed on the top of said E section with said bottom side placed on top of the legs of said E section; and a planar coil is placed such way that the said legs of said E core section penetrate through the openings of said planar coil; the windings of said planar cores surrounding the center leg of said E shaped core.

2. A magnetic storage element as set forth in claim 1 further comprising:
    an electrically conductive material placed on said bottom of said I shaped magnetic core on the area not covered by the said legs of said E magnetic core section.

3. A magnetic storage element as set forth in claim 1 further comprising:
    at least one additional plate made of high permeability material placed on said bottom of said I shaped magnetic core made of distributed gap material on the area not covered by the said legs of said E magnetic core section.

4. A magnetic storage element as set forth in claim 1 further comprising:
    an electrically conductive material placed on the edges of said I shaped magnetic sore.

5. A magnetic storage element comprising:
    a magnetic core comprising of an E shaped section and an I shaped section; the said I section made of distributed gap material and said E section made of high permeability material; the said I shaped section having a top and a bottom side; an additional I shaped section made of high permeability material is placed on said top side of I shaped section made of distributed gap material; the bottom side of said I section made of distributed gap material is placed on the top of said E section on top of the legs of said E section; and a planar coil is placed such way that the said legs of said E core section penetrate through the openings of said planar coil; the windings of said planar cores surrounding the center leg of said E shaped core.

6. A magnetic storage element as set forth in claim 5 further comprising:
    an electrically conductive material placed on said bottom of said I shaped magnetic core made of distributed gap material on the area not covered by the said legs of said E magnetic core section.

7. A magnetic storage element as set forth in claim 5 further comprising:
    at least one additional plate made of high magnetic permeability material is placed on said bottom of said I shaped magnetic core made of distributed gap material on the area not covered by the said legs of said E magnetic core section.

8. A magnetic storage element comprising:
    a magnetic core comprising of an E shaped section and an I shaped section; the said I section made of high permeability material and said E section made of high permeability material with the center leg longer than the outer legs; the said I shaped section having a top and a bottom side; a cavity sized to accommodate the center leg of said E shape is carved in said bottom side of said I core; the said cavity is sized to create a gap in between the said I section and said center leg of said E section; and a planar coil is placed such way that the said legs of said E core section penetrates through the opening of said planar coil; the windings of said planar coil surrounding the center leg of said E shaped core.

9. A magnetic storage element comprising:
    a magnetic core comprising of an E shaped section and an I shaped section; the said I section made of high permeability material and said E section made of high permeability material; the said I shaped section having a top and a bottom side; three cavities are sized to accommodate the center leg and outer legs of said E shape are carved in said bottom side of said I core; the said cavities are sized to create a gap in between the said I section and the said center leg of said E section and said outer legs of said E section; and a planar coil is placed such way that the said legs of said E core section penetrates through the opening of said planar coil; the windings of said planar cores surrounding the center leg of said E shaped core.

10. A magnetic storage element comprising:

a magnetic core comprising of an E shaped section and an I shaped section; the said I section made of high permeability material and said E section made of high permeability material with the center leg shorter than the outer legs; the said I shaped section having a top and a bottom side; the bottom side of said I shaped section is placed on top of the legs of said E section; at least one additional plate made of high permeability material is placed on the bottom side of said I section in between said legs of said E section; the said additional plate is sized to create a gap in between the said additional plate and said center leg of said E section; and a planar coil is placed such way that the said legs of said E core section penetrates through the opening of said planar coil; the windings of said planar cores surrounding the center leg of said E shape core.

11. A magnetic storage element comprising:

a magnetic core comprising of an E shaped section and an I shaped section; the said I section made of high permeability material and said E section made of high permeability material with the center leg shorter than the outer legs; the said I shaped section having a top and a bottom side; the bottom side of said I shape section is placed on top of the legs of said E section; and a planar coil is placed such way that the said legs of said E core section penetrates through the opening of said planar coil; the windings of said planar cores surrounding the center leg of said E shaped core; said planar coil has a top side and a bottom side, the top side placed towards the said I section of the core; at least one additional plate made of high permeability material is placed on the top side of said planar coil in between said legs of said E section; said additional plate is sized to create a gap in between said additional plate and said center leg of said E section.

12. A magnetic storage element comprising:

a magnetic core comprising of an E shaped section and an I shaped section; the said I section made of high permeability material and said E section made of high permeability material; the said I shaped section having a top and a bottom side; the bottom side of said I shape section is placed on top of the legs of said E section maintaining a gap in between; and a planar coil is placed such way that the said legs of said E core section penetrates through the opening of said planar coil; said planar coil has a top side and a bottom side, the top side placed towards the said I section of the core, the windings of said planar cores surrounding the center leg of said E shaped core; at least one additional plate made of high permeability material is placed on the top side of said planar coil in between said legs of said E section; said additional plate is sized to create a gap in between said additional plate and said center leg and outer legs of said E section.

13. A magnetic storage element comprising:

a magnetic core comprising of an E shaped section and an I shaped section; the said I section made of high permeability material and said E section made of high permeability material; the said I shaped having a top and a bottom side; the bottom side of said I shape section is placed on top of the legs of said E section; and a planar coil is placed such way that the said legs of said E core section penetrates through the opening of said planar coil; the windings of said planar cores surrounding the center leg of said E shaped core; said planar coil has a top side and a bottom side, the top side placed towards the said I shaped section of the core; at least one additional plate made of high permeability material is placed on the top side of said planar coil in between said legs of said E section; said additional plate is sized to create a gap in between said additional plate and said center leg of said E section.

\* \* \* \* \*